(12) United States Patent
Guan et al.

(10) Patent No.: US 9,783,412 B2
(45) Date of Patent: Oct. 10, 2017

(54) METHOD FOR IMPROVING MANUFACTURABILITY OF CAVITY PACKAGES FOR DIRECT TOP PORT MEMS MICROPHONE

(71) Applicant: Unisem (M) Berhad, Kuala Lumpur (MY)

(72) Inventors: Junhua Guan, Chengdu (CN); Ming Xiang Tang, Chengdu (CN); Alan Evans, Bristol (GB)

(73) Assignee: Unisem (M) Berhad, Kuala Lumpur (MY)

( * ) Notice: Subject to any disclaimer, the term of this patent is extended or adjusted under 35 U.S.C. 154(b) by 436 days.

(21) Appl. No.: 14/608,645

(22) Filed: Jan. 29, 2015

(65) Prior Publication Data

US 2016/0221821 A1   Aug. 4, 2016

(51) Int. Cl.

| H04R 25/00 | (2006.01) |
|---|---|
| B81B 7/00 | (2006.01) |
| H04R 23/00 | (2006.01) |
| H04R 1/04 | (2006.01) |
| H04R 19/04 | (2006.01) |
| G01L 9/00 | (2006.01) |
| H04R 19/00 | (2006.01) |
| H04S 7/00 | (2006.01) |

(52) U.S. Cl.
CPC .......... *B81B 7/0077* (2013.01); *B81B 7/0061* (2013.01); *G01L 9/0073* (2013.01); *H04R 1/04* (2013.01); *H04R 19/005* (2013.01); *H04R 19/04* (2013.01); *H04R 23/006* (2013.01); *H04S 7/00* (2013.01); *B81B 2201/0257* (2013.01); *H04R 2201/003* (2013.01); *H04S 2420/01* (2013.01)

(58) Field of Classification Search
CPC ........ H04R 1/04; H04R 19/00; H04R 19/005; H04R 19/013; H04R 19/02; H04R 19/04; H04R 23/006; H04R 2201/003; B81B 7/0061; B81B 7/0077; B81B 2201/0257
USPC ....... 381/113, 116, 369, 173, 174, 175, 190, 381/191; 29/25.41, 25.42; 367/170, 181
See application file for complete search history.

(56) References Cited

U.S. PATENT DOCUMENTS

| 4,691,363 | A * | 9/1987 | Khanna | ................... | H04R 1/04 |
| | | | | | 381/191 |
| 7,466,834 | B2 * | 12/2008 | Ogura | .................. | B81B 7/0061 |
| | | | | | 381/174 |
| 8,199,939 | B2 * | 6/2012 | Suvanto | ............... | H04R 19/005 |
| | | | | | 381/175 |

(Continued)

*Primary Examiner* — Huyen D Le
(74) *Attorney, Agent, or Firm* — Wiggin and Dana LLP; Gregory S. Rosenblatt

(57) ABSTRACT

A MEMS device for use in some embodiments in a microphone or pressure sensor and method of making the same wherein a portion of the package surrounding the acoustic port is deformed either away from, towards, or both away from and towards the interior of the package. By providing this raised area proximate the acoustic port, external debris is less likely to enter the acoustic port and damage the fragile MEMS die. Further, internal attachment material holding the MEMS die to the inside of the package is prevented by flowing into and obscuring the acoustic port. The advantages of this design include longer operation lifetimes for the MEMS device, greater design freedom, and increases in production yield.

10 Claims, 5 Drawing Sheets

(56) References Cited

U.S. PATENT DOCUMENTS

2014/0072151 A1* 3/2014 Ochs .................... H04R 23/00
                                                    381/174
2016/0212548 A1* 7/2016 Salmon ................. H04R 19/04

* cited by examiner

METHOD FOR IMPROVING MANUFACTURABILITY OF CAVITY PACKAGES FOR DIRECT TOP PORT MEMS MICROPHONE

FIELD OF THE DISCLOSURE

Disclosed is a package for housing a microelectromechanical system (MEMS) device with improved protection for the MEMS device disposed therein, and further a method of manufacture for the package, particularly for use as a MEMS microphone.

BACKGROUND OF THE DISCLOSURE

MEMS devices have been incorporated into personal electronic devices which commonly employ at least one microphone to enable voice communication between the user and the device. In some systems, the MEMS device is an acoustic transducer, deflection by sound waves of a diaphragm within the device results in a change of capacitance which can be measured, interpreted, and translated by the device into a desired output (e.g. a voice command for controlling software on the device). The MEMS device is often enclosed within a frame or package and attached to the interior of the package near a hole or port which allows the interior of the package to communicate with the surrounding environment. Sound thus enters the package through this port and acts upon the MEMS device.

Performance of the MEMS device is vital to successful operation of the system and the electronic device as a whole. With electronic devices becoming part of the day to day lives of most individuals and thus subject to the day-to-day wear and tear that does along with it, maintaining reliability of the devices has become an increasing issue. Given the fragility and sensitivity of the MEMS device, it vital to protect the device from dust, dirt, and any other material or force which could lead to mechanical damage. Further, optimal performance of the device is predicated at least in part on the device's ability to sense the acoustic environment outside (and inside) of the system. Therefore, it is important that the package be designed to prevent potential obstruction of the port and maintain and clear pathway for travel of sound waves and deflection of the diaphragm.

Methods of making generic MEMS device packages are known in the art, such as in United States patent applications US 2014/0246738 and US 2014/0246739, which are incorporated herein by reference in their entireties.

MEMS device packages with increased protection for the MEMS device therein are disclosed in U.S. Pat. Nos. 4,691,363 and 8,130,979, both of which are incorporated herein by reference in their entireties.

U.S. Pat. No. 4,691,363 discloses a MEMS device package including a sound port that is mounted over the passage between the surrounding environment of the package and the MEMS device located within. U.S. Pat. No. 8,130,979 also discloses a MEMS device package where a cap is mounted over the port and provides communication between the surrounding environment and the MEMS device located at the other end of the port.

MEMS device packages with internal structures for preventing flow of material into the acoustic port are disclosed in U.S. Pat. No. 7,537,964, which is incorporated herein by reference in its entirety. U.S. Pat. No. 7,537,964 discloses a MEMS device package that includes an internal retaining ring for preventing wicking of material into the sound port or onto the MEMS device.

Demands on the package housing a MEMS device are stringent. Package designs are progressing in two directions: better performance through optimization of certain design parameters and miniaturization to comply with the spatial constraints of ever more compact electronic devices. Additionally, while the complexity of these devices continues to increase, there is a continued desire to simplify the manufacturing process to keep production costs as low as possible and improve efficiency.

There is a desire, therefore, for a durable MEMS device package which allows for increased design freedom, decreased manufacturing complexity and cost, and improved manufacturing efficiency.

BRIEF SUMMARY

Disclosed herein is a method of making a microelectromechanical system. In one embodiment, the method includes the steps of providing a package base having a first interior portion and a first perimeter, providing a lid on the package base to define a cavity, the lid having a second interior portion and a second perimeter, wherein the first interior portion and the second interior portion are substantially planar, providing a non-planar portion on one of the first interior portion and the second interior portion, extending a port through the non-planar portion to the cavity, providing an attachment portion within the cavity and proximate the port, and configuring the attachment portion to receive a MEMS device. In some embodiments, the step of providing a non-planar portion on one of the first interior portion and the second interior portion includes the step of deforming material in one of the first interior portion and the second interior portion. In some embodiments, the step of deforming material in one of the first interior portion and the second interior portion deforms at least a portion of one of the first interior portion and the second interior portion into the cavity. In some embodiments, the step of deforming material in one of the first interior portion and the second interior portion deforms at least a portion of one of the first interior portion and the second interior portion away from the cavity. In some embodiments, the step of deforming material in one of the first interior portion and the second interior portion deforms at least a portion of one of the first interior portion and the second interior portion into and away from the cavity.

In a further embodiment, the method of making a microelectromechanical system includes the steps of providing a package base having a first interior portion and a first perimeter, providing a lid on the package base to define a cavity, the lid having a second interior portion and a second perimeter, deforming material in one of the first interior portion and the second interior portion into, away from, or both into and away from the cavity to provide a non-planar portion, extending a port through the non-planar portion, the port allowing acoustic communication between the cavity and an environment surrounding the microelectromechanical system, and providing an attachment portion within the cavity and substantially surrounding the non-planar portion for receiving a MEMS device.

Also disclosed herein are packages produced by the methods described in the exemplary embodiments above. In some embodiments, the package includes a package base having a first interior portion and a first perimeter portion, a lid having a second interior portion and a second perimeter portion, wherein the first interior portion and the second interior portion are substantially planar, a cavity defined by the package base and the lid, a non-planar portion in at least one of the first interior portion and the second interior portion, a port extending through the non-planar portion to the cavity; and an attachment portion within the cavity and proximate the port, wherein the attachment portion is configured to receive a MEMS device. In some embodiments, the non-planar portion is configured to substantially prevent flow of an attachment material from entering the port. In some embodiments, the attachment material is selected from the group consisting of: epoxy, silicone, glue, and combinations thereof. In some embodiments, the non-planar portion extends away from the cavity. In some embodiments the non-planar portion extends both into and away from the cavity. In some embodiments, the attachment portion substantially surrounds the non-planar portion.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION

Figure 1:
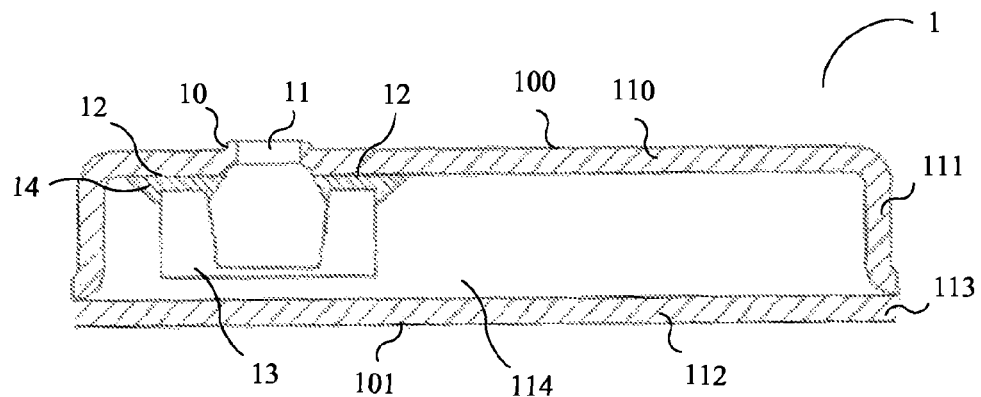
FIG. 1 depicts a cross-sectional view of a top port MEMS package device consistent with one embodiment of the present disclosure.

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

Figure 2:
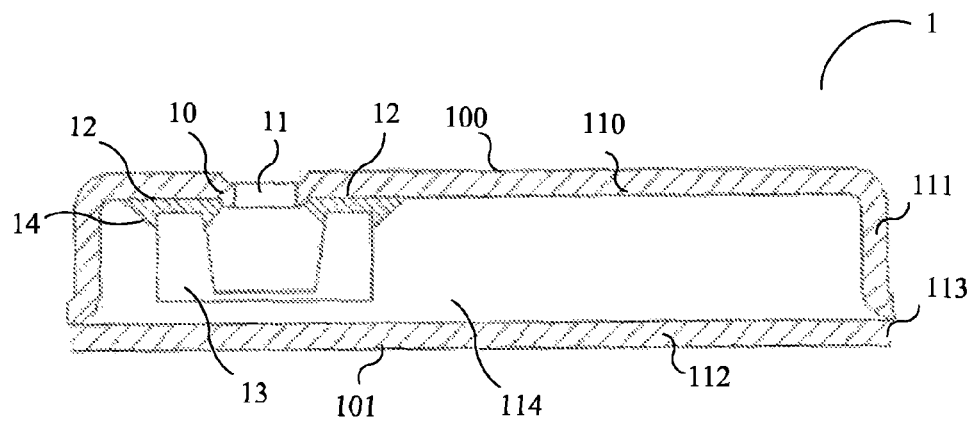
FIG. 2 depicts a cross-sectional view of a further embodiment of the MEMS package device shown FIG. 1.
Figure 3:
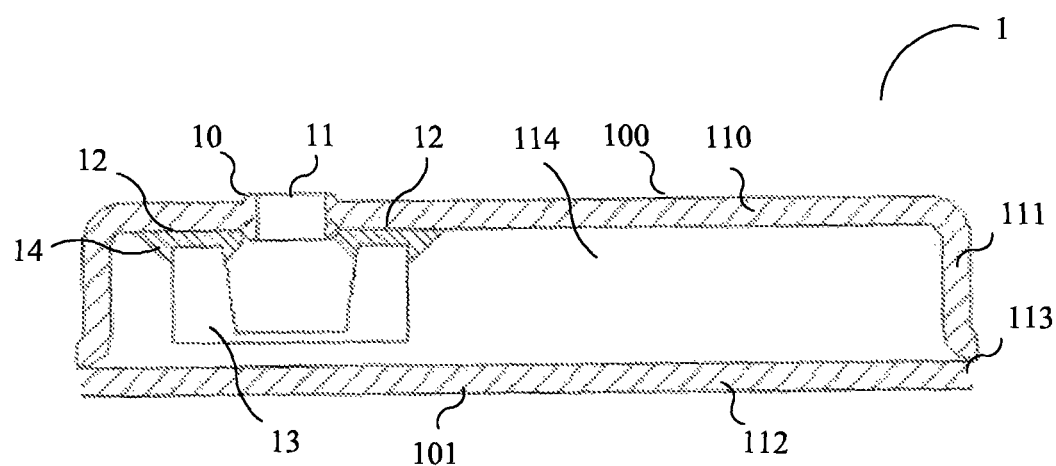
FIG. 3 depicts a cross-sectional view of a further embodiment of the MEMS package devices shown in FIGS. 1 and 2.

FIGS. 1-3 show cross-sectional views of various embodiments of a top port MEMS package device 1 of the present disclosure. In some embodiments, MEMS package device 1 includes a lid 100 and a package base 101. Lid 100 is defined by an interior portion 110 and a perimeter portion 111. Package base 101 is likewise defined by an interior portion 112 and a perimeter portion 113. In some embodiments, MEMS package device 1 may also include walls. As shown in FIG. 1, in some embodiments perimeter portion 111 themselves form the walls. In some embodiments, the walls are formed by perimeter portion 113. In some other embodiments, the boundaries of the package are defined by other structures found within the device into which MEMS package device 1 is integrated. In some embodiments, MEMS package device 1 is not bound by walls at all, but rather by curved lid 100 or package base 101 structures which interface at perimeter portions 111 and 113. The general size and shape of MEMS package device 1, including the presence or absence of wall structures, are matters of design choice well within the capabilities of those having ordinary skill in the art.

In some embodiments, interior portions 110 and 112 are substantially planar. When assembled, therefore, lid 100 and package base 101 define a cavity 114. In some embodiments, cavity 114 will house MEMS device 13 (discussed in greater detail below) and other electrical components as well (not pictured). Cavity 114 provides protection for these fragile and sensitive components and in some embodiments, is designed to approximate the conditions of the surround environment as close as possible to increase performance of MEMS package device 1.

A non-planer portion 10 is provided in one of lid 100 and package base 101, although FIGS. 1-3 only show exemplary embodiments with non-planar portion 10 on lid 100. In some embodiments, such as FIG. 1, non-planar portion 10 rises above lid 100 in a direction generally away from cavity 114. In some embodiments, such as that shown in FIG. 2, non-planar portion 10 extends into cavity 114. In some embodiments, such as that shown in FIG. 3, non-planar portion 10 extends in multiple directions, such as into and away from cavity 114.

In some embodiments, port 11 is included in non-planar portion 10 and provides communication between cavity 114 and the environment surrounding MEMS package device 1. The size and shape of non-planar portion 10 and port 11 is a matter of design choice, and design of port 11 will be discussed in greater detail below. In some embodiments, a MEMS device 13 is located within cavity 114 and attached to a surface within cavity 114 at an attachment portion 12. In some embodiments, as shown in FIGS. 1-3, MEMS device 13 is located within cavity 114 and covers the inside of port 11 at an attachment portion 12 which surrounds port 11. In some embodiments, MEMS device 13 does not cover all of and/or completely surround port 11. In some embodiments, MEMS device 13 does not cover port 11 at all. In some embodiments, MEMS device 13 is attached to attachment portion 12 using at least one adhesive material 14, such as epoxy, silicone, glue, and the like.

In some embodiments, MEMS package device 1 is a microphone. In other embodiments, MEMS package device 1 is a pressure sensor. The benefits realized from non-planar portion 10 depend on whether non-planar portion 10 extends generally away from cavity 114 or into cavity 114. When non-planar portion 10 extends above interior portion 110, non-planar portion 10 acts as a guard, preventing material such as dust and other debris from entering port 11 via interior portion 110 and potentially damaging the fragile MEMS device 13. In some embodiments of MEMS package device 1 in this configuration, non-planar portion 10 also acts as a reservoir to contain attachment material 14 and redirect flow of attachment material 14 away from MEMS device 13. When non-planar portion 10 extends into cavity 114, it again acts as a guard or dam that stops attachment material 14 from flowing into port 11. Attachment material 14 is therefore prevented from obstructing port 11, interfering with sound waves or pressure changes through port 11, and causing decreased performance of MEMS package device 1.

By limiting the risk of damage or obstruction to MEMS device 13, the design constraints for the package can be relaxed and production yield can be increased.

Figure 4:
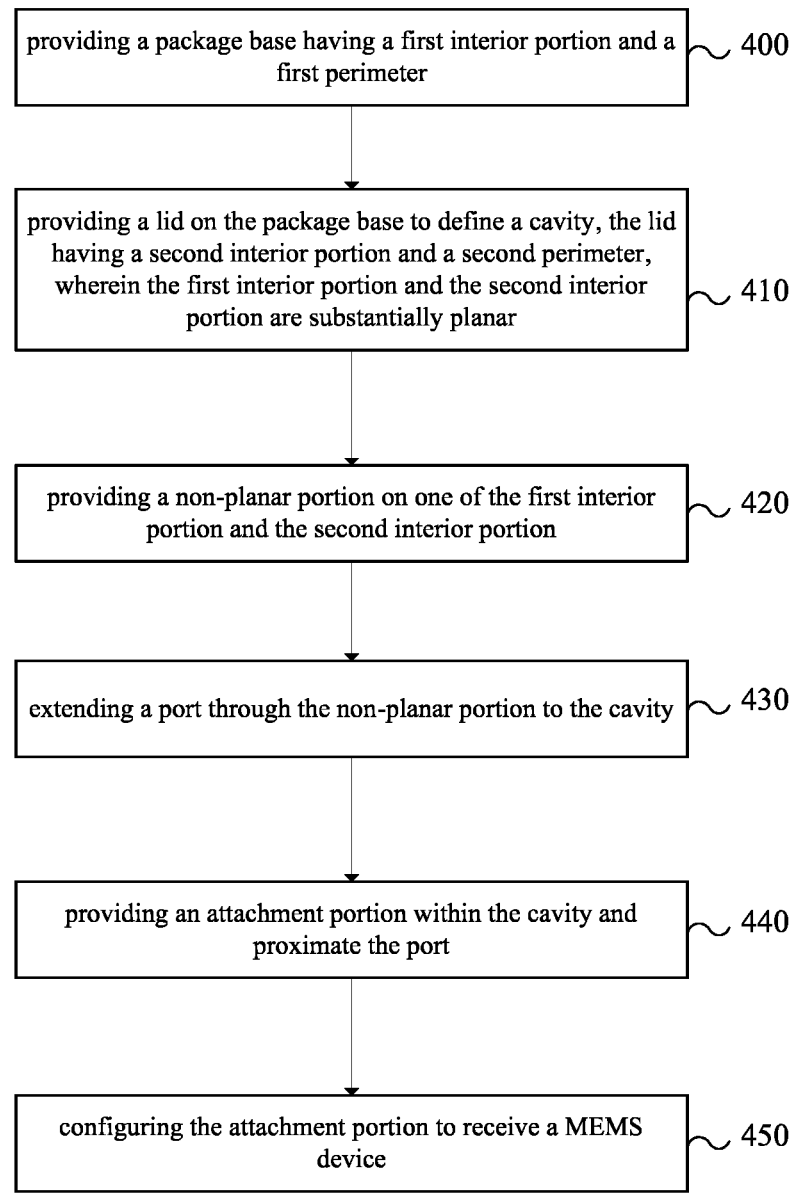
FIG. 4 depicts a method of making the MEMS package device shown in FIG. 1.
Figure 5:
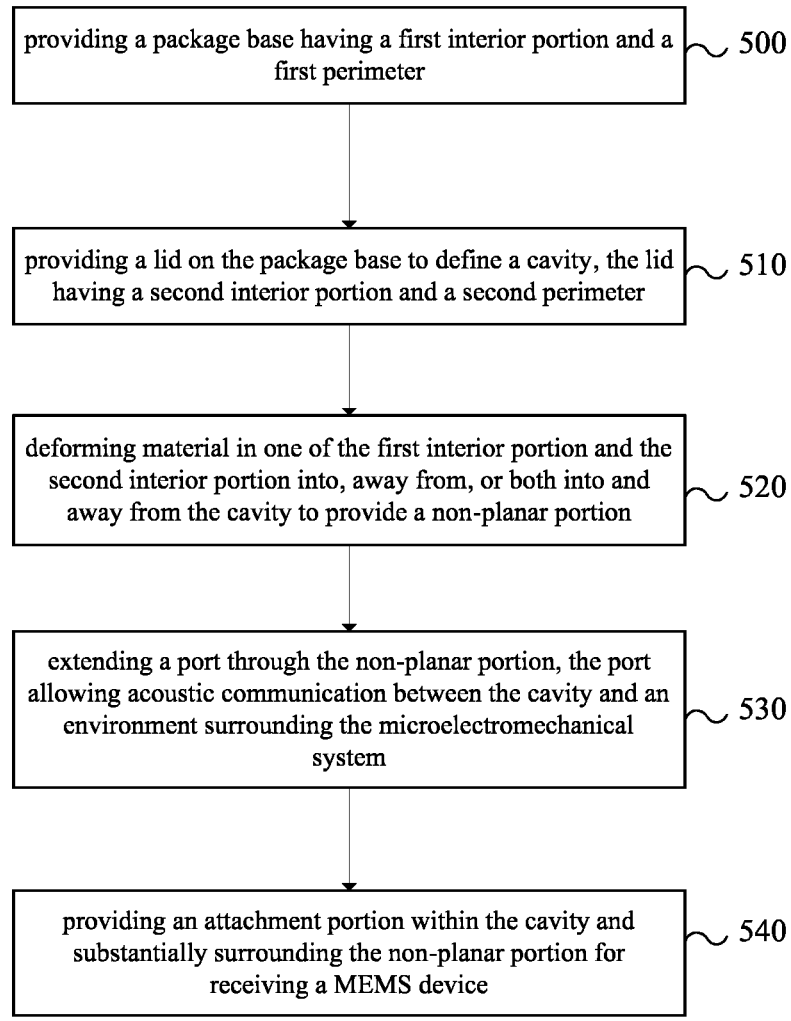
FIG. 5 depicts a method of making the MEMS package device shown in FIGS. 1-3.
Figure 6:
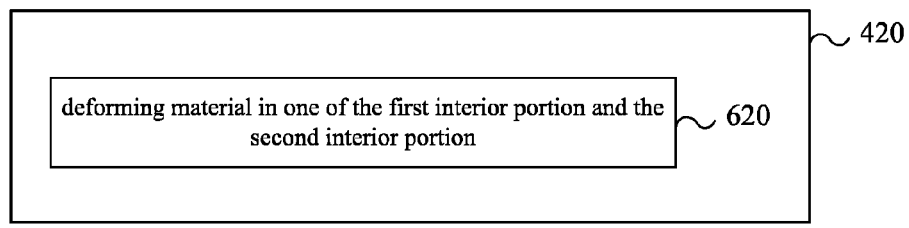
FIG. 6 depicts a specific embodiment of the method step of providing a non-planar portion on one of the first interior portion and the second interior portion from FIG. 4.
Figure 7:
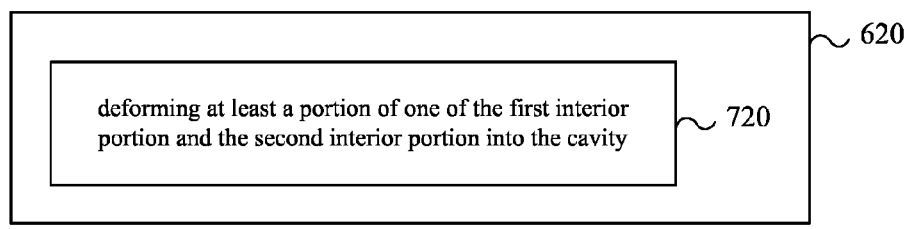
FIG. 7 depicts a specific embodiment of the method step of deforming material in one of the first interior portion and the second interior portion from FIG. 6.
Figure 8:
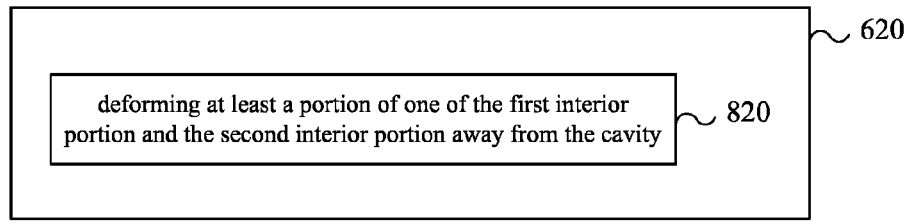
FIG. 8 depicts a specific embodiment of the method step of deforming material in one of the first interior portion and the second interior portion from FIG. 6.
Figure 9:
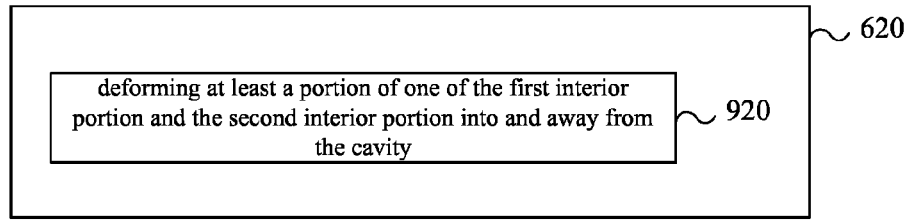
FIG. 9 depicts a specific embodiment of the method step of deforming material in one of the first interior portion and the second interior portion from FIG. 6.

FIGS. 4-9 show embodiments of a method for making MEMS package device 1 discussed in the above paragraphs. In some embodiments, the method of making MEMS package device 1 includes providing 400 a package base having a first interior portion and a first perimeter. A lid is provided 410 to define a cavity, the lid having a second interior portion and a second perimeter. While providing step 410 shows a package where first interior portion and second interior portion are planar, FIG. 5 shows a providing step 510 wherein planarity of the first and second interior portions is not required. In some embodiments, the providing steps 400 and 410 are performed in successive steps in some order. In some embodiments, the providing steps 400 and 410 are performed simultaneously, for instance where the entire package is cast in a single step.

The method further includes the step of providing 420 a non-planar portion on one of the first interior portion and the second interior portion. In some embodiments, providing step 420 may occur subsequent to at least one of providing step 400 and providing step 410. In some embodiments, providing step 420 occurs simultaneously with at least one of providing step 400 and providing step 410. In some embodiments, such as the one shown in FIG. 6, providing step 420 is performed by deforming 620 material in one of the first interior portion and the second interior portion.

In some embodiments, such as the embodiment shown in FIG. 4, a port is extended 430 through the non-planar portion of the cavity. In some embodiments, such as the one shown in FIG. 5, an extending step 530 allows acoustic communication between the cavity and an environment surrounding MEMS package device 1. In some embodiments, providing step 420 is performed first, and extending step 430 is performed afterwards. In other embodiments, the port is extended through at least one of the first interior portion and the second interior portion prior to the formation of the non-planar portion. In this embodiment, after the port has been provided, the area surrounding the port is deformed to provide the non-planar portion.

In some embodiments where the port is extended 430 or first provided (discussed above, not pictured), material in one of the first interior portion and the second interior portion is deformed 520 into, away from, or both into and away from the cavity of MEMS package device 1. Such a step is shown in FIG. 5, as well as in FIGS. 7-9. Deformation steps 520, 720, 820, and/or 920 may be performed with any suitable technique using any suitable apparatus and at any suitable conditions.

In some embodiments, an attachment portion is provided 440 within the cavity and proximate the port and configured 450 to receive a MEMS device. As discussed above, the MEMS device may be attached using any suitable adhesive process, like application of adhesives such as epoxy, silicone, glue, and the like. In some embodiments, such as the one shown in FIG. 5, an attachment portion is provided 540 within the cavity and substantially surrounding the non-planar portion. In some embodiments, the attachment portion substantially surrounds the port.

One or more embodiments of the present invention have been described. Nevertheless, it will be understood that various modifications may be made without departing from the spirit and scope of the invention. Accordingly, other embodiments are within the scope of the following claims.

What is claimed is:

1. A package to house a microelectromechanical system (MEMS) device comprising:
   a package base having a first interior portion and a first perimeter portion;
   a lid having a second interior portion and a second perimeter portion, wherein the first interior portion and the second interior portion are substantially planar;
   a cavity defined by the package base and the lid;
   a non-planar portion in at least one of the first interior portion and the second interior portion, wherein the non-planar portion is configured to substantially prevent flow of an attachment material from entering the port;
   a port extending through the non-planar portion to the cavity; and
   an attachment portion within the cavity and proximate the port, wherein the attachment portion is configured to receive a MEMS device.

2. The microelectromechanical system according to claim 1, wherein the attachment material is selected from the group consisting of: epoxy, silicone, glue, and combinations thereof.

3. The microelectromechanical system according to claim 1, wherein the non-planar portion extends away from the cavity.

4. The microelectromechanical system according to claim 1, wherein the non-planar portion extends both into and away from the cavity.

5. The microelectromechanical system according to claim 1, wherein the attachment portion substantially surrounds the non-planar portion.

6. A method of making a microelectromechanical system comprising the steps of:
   providing a package base having a first interior portion and a first perimeter;
   providing a lid on the package base to define a cavity, the lid having a second interior portion and a second perimeter, wherein the first interior portion and the second interior portion are substantially planar;
   providing a non-planar portion on one of the first interior portion and the second interior portion by deforming material in one of the first interior portion and the second interior portion;
   extending a port through the non-planar portion to the cavity;
   providing an attachment portion within the cavity and proximate the port; and
   configuring the attachment portion to receive a MEMS device.

7. The method of making a microelectromechanical system according to claim 6, wherein the step of deforming material in one of the first interior portion and the second interior portion deforms at least a portion of one of the first interior portion and the second interior portion into the cavity.

8. The method of making a microelectromechanical system according to claim 6, wherein the step of deforming material in one of the first interior portion and the second interior portion deforms at least a portion of one of the first interior portion and the second interior portion away from the cavity.

9. The method of making a microelectromechanical system according to claim 6, wherein the step of deforming material in one of the first interior portion and the second interior portion deforms at least a portion of one of the first interior portion and the second interior portion into and away from the cavity.

10. A method of making a microelectromechanical system comprising the steps of:
   providing a package base having a first interior portion and a first perimeter;
   providing a lid on the package base to define a cavity, the lid having a second interior portion and a second perimeter;
   deforming material in one of the first interior portion and the second interior portion into, away from, or both into and away from the cavity to provide a non-planar portion;
   extending a port through the non-planar portion, the port allowing acoustic communication between the cavity and an environment surrounding the microelectromechanical system; and
   providing an attachment portion within the cavity and substantially surrounding the non-planar portion for receiving a MEMS device.

\* \* \* \* \*